(12) United States Patent
Prystupa et al.

(10) Patent No.: US 11,169,088 B2
(45) Date of Patent: Nov. 9, 2021

(54) HIGH RESOLUTION MULTIPLEXING SYSTEM

(71) Applicant: 11093568 Canada Ltd., Winnipeg (CA)

(72) Inventors: David Allan Prystupa, Pinawa (CA); John Stephen Pacak, Winnipeg (CA); Peter Condie Nell, Winnipeg (CA)

(73) Assignee: 11093568 Canada Ltd., Winnipeg (CA)

( * ) Notice: Subject to any disclaimer, the term of this patent is extended or adjusted under 35 U.S.C. 154(b) by 0 days.

(21) Appl. No.: 16/683,357

(22) Filed: Nov. 14, 2019

(65) Prior Publication Data
US 2020/0150036 A1  May 14, 2020

Related U.S. Application Data

(60) Provisional application No. 62/767,186, filed on Nov. 14, 2018.

(51) Int. Cl.
| | |
|---|---|
| *G01N 21/552* | (2014.01) |
| *G01J 3/02* | (2006.01) |
| *G01N 21/65* | (2006.01) |
| *G01N 21/35* | (2014.01) |

(52) U.S. Cl.
CPC ............ *G01N 21/552* (2013.01); *G01J 3/021* (2013.01); *G01J 3/0237* (2013.01); *G01J 3/0294* (2013.01); *G01N 21/65* (2013.01); *G01N 2021/3595* (2013.01)

(58) Field of Classification Search
CPC ........ G01J 3/021; G01J 3/0237; G01J 3/0294; G01J 1/44; G01J 2001/442; G01N 2021/3595; G01N 21/552; G01N 21/65
See application file for complete search history.

(56) References Cited

U.S. PATENT DOCUMENTS

| | | |
|---|---|---|
| 8,576,116 B2 | 11/2013 | Matsuo |
| 2002/0118129 A1 | 8/2002 | Moussanet et al. |

OTHER PUBLICATIONS

Stoica et al. A Low-Complexity Noncoherent IR-UWB Transceiver Architecture With TOA Estimation; in IEEE Transactions on Microwave Theory and Techniques, vol. 54, No. 4, Apr. 2006, pp. 1637-1646 *p. 1639, left col.: Fig. 1*.

*Primary Examiner* — Tri T Ton
(74) *Attorney, Agent, or Firm* — Adrian D. Battison; Ade & Company Inc.; Ryan W. Dupuis

(57) ABSTRACT

A method is provided for measuring time varying particle fluxes with improved temporal resolution and signal to noise ratio. The particles can be photons, neutrons, electrons or electrically charged particles. The method includes a set of electronic and/or optical components and a set of algorithms that implement N-fold temporal multiplexing of the input flux. The system can be used to measure other types of flux by using a transducer to convert the flux into a compatible form. The system can include a transducer such as a scintillator that operates to convert particle flux incident into a photon flux proportional to the amplitude of particle flux. The invention can be used with multiplexing methods known to those skilled in the art, for example Hadamard and Fourier methods.

22 Claims, 5 Drawing Sheets

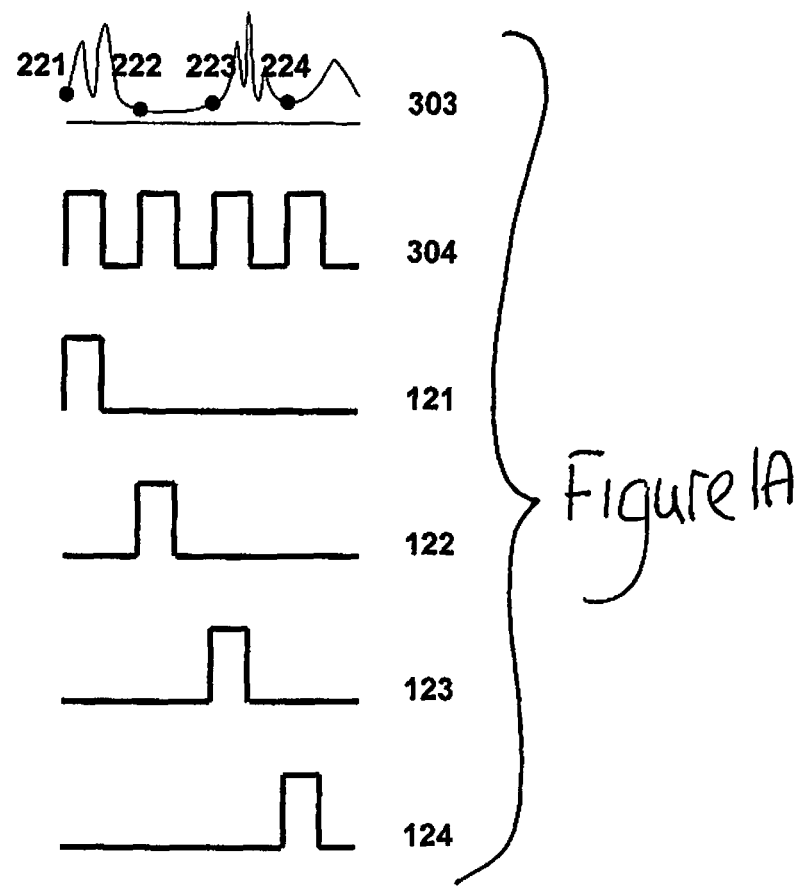
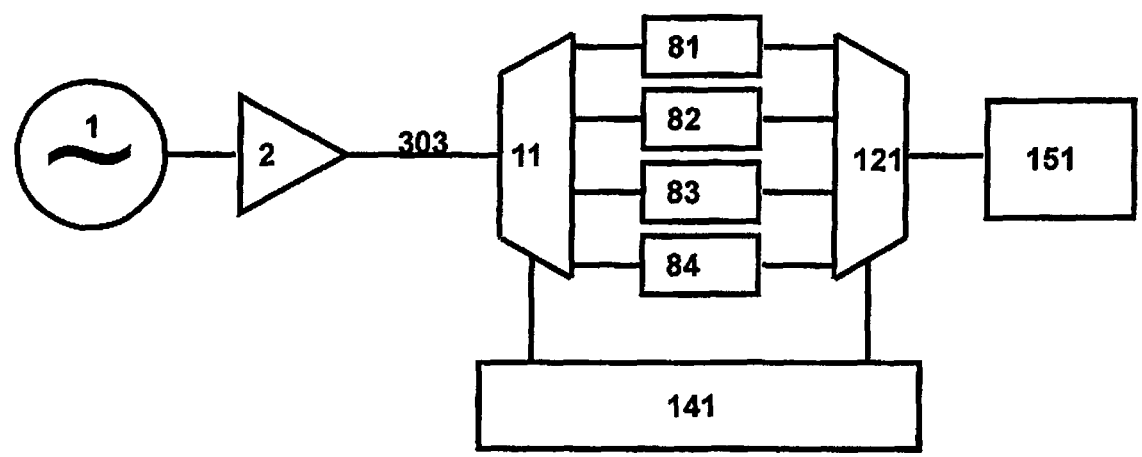
Figure 1

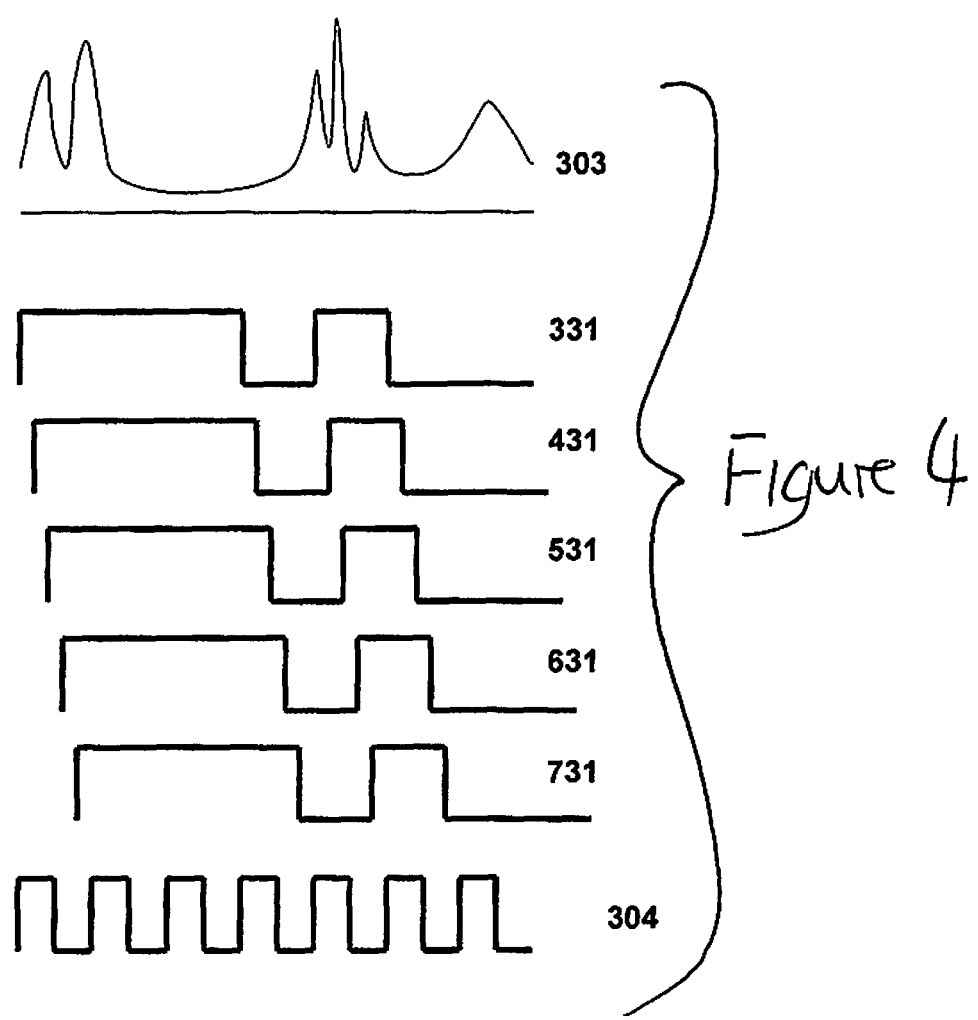

HIGH RESOLUTION MULTIPLEXING SYSTEM

The invention pertains to a method and device for measuring time varying particle fluxes with improved temporal resolution and improved signal to noise ratio. The particles can be photons, neutrons, electrons and electrically charged particles.

BACKGROUND OF THE INVENTION

The amplitude of particle fluxes is conventionally measured by collecting the particle flux, directing the particle flux onto a transducer that produces an electrical signal (voltage or current) with amplitude proportional to the particle flux, conditioning the electric signal, and comparing the electric signal with a set of standard electric signals to assign a numeric value to the particle flux amplitude. The last step is conventionally done with analog to digital converters (ADC).

Analog to digital converters act as an interface between analog electric signals and a digital computation device for applications that range from instrumentation, to radar to communications. Two main criteria are used to specify the performance of an ADC, the sampling rate expressed in Hz and the precision. The precision of an ADC is variously expressed in dB or effective number of bits (ENOB). Generally, the precision of an ADC declines as the sampling rate increases and hence the precision of the particle flux measurement also declines. One general object of the invention is to increase the precision of particle flux measurements at high sampling rates. A further major goal of the invention is to increase the maximum sampling rate achievable so that changes in particle flux over a short temporal interval can be resolved.

In prior art, high frequency ADC's (>1 GHz) typically consist of a stack of two or more lower rate ADC's that are temporally interleaved to achieve precision close to that of the lower rate ADC. These designs rely on timing circuits to route the input signal to each ADC in the stack in sequence. An error is introduced because there is jitter in the timing signals. A goal of the present invention is to reduce the error caused by jitter in the timing signals. Further errors are introduced variability between interleaved ADC's in a stack, specifically, there are offset and gain error. A goal of the invention is to reduce effects of gain and offset errors.

The invention can be used in applications such as radar, communications and instrumentation that require both a high data rate and high precision and accuracy. An exemplary application of the invention is a multi-gigahertz signal analyzer, henceforth GSA. The exemplary GSA takes optical or electronic signals as input. The GSA is illustrative of the concepts of the invention and does not limit the scope of the invention.

SUMMARY OF THE INVENTION

The invention provides a multiplex method for measuring the temporal dependence of a particle flux. The particles can be electrons, ions, neutrons or photons. In the context of the following discussion, the term flux refers to either the number of particles per unit time or the energy carried by said particles per unit time crossing a plane normal to the direction of motion.

The invention is a system comprising a set of electronic and/or optical components and a set of algorithms that implement N-fold temporal multiplexing of the input flux. The input flux may be electrons or photons or ions or neutrons. The system can be used to measure other types of flux by using a transducer to convert the flux into a compatible form. For example the system can include a transducer such as a scintillator that operates to convert particle flux incident into a photon flux proportional to the amplitude of particle flux. The invention can be used with multiplexing methods known to those skilled in the art, for example Hadamard and Fourier methods.

Preferably but not necessarily the invention is used with high efficiency multiplexing (HEMS) described in U.S. application Ser. No. 15/987,279 filed May 23, 2018 by the present Applicant, which corresponds to PCT Application PCT/CA2018/050599 published on 29 Nov. 2018 as WO 2018/213923 the disclosure of which is incorporated herein by reference. HEMS is a method to improve the signal to noise ratio (SNR) of particle flux measurements. The description below includes some references to HEMS and it will be appreciated that these are merely exemplary and the invention herein can be used with other methods.

In the following descriptions, the following definitions apply:
N (positive integer)>2 length of code sequence and number of paths for "equivalent" signals from amplifier ie original signal is amplified N-fold and split into N parts following N paths.
N=number of time intervals
d (positive integer) number of integrating channels d=1 Hadamard d>1 HEMS
Nd (positive integer) number of integrated signals
k+N (positive integer) k is time interval index and N is number of intervals in sequence
B (vector/column matrix) N×1 output time spectrum
B is vector describing the particle flux $\phi$ in which each successive row of B corresponds to the average flux during successive period
H (matrix)=$(Z^T Z)^{-1} Z^T$ general case $Z^{-1}$ Hadamard case (defined by Equation 4)
Y (vector/column matrix) length Nd
HY (matrix*vector=vector)

The input flux $\Phi$ is connected to a signal conditioning device. The signal conditioning device may have no effect or the signal conditioning device may be an amplifier or the signal conditioning device may add the input flux to another flux. The output from the signal conditioning device is divided into N substantially equal parts and each part each with flux $\phi=\Phi/N$ is directed along a different path to a different gate device. Each gate device is connected to at least one integrating device. In HEMS embodiments there are d integrating devices, where d is an integer greater than 1. The gate device functions to either block the flux $\phi$, or to direct all of the flux to one of d integrating devices based on a pre-set code sequence of length N. The integrating device functions to produce an electric signal proportional to the integrated flux it receives from the gate device. Each element in the code sequence identifies the action to be taken by the gate device for time interval $\tau$. Preferably the time intervals are equal and the total integration time is T=N$\tau$. The arrangement herein will work with unequal time intervals in which case the total integration time is T=$\Sigma\tau_i$. At the end of each integration period T, each integrating device transfers an electric signal proportional to the integrated flux to either an optional buffering device or directly to an ADC of conventional design. The buffering device stores the electric signal from the integrating device substantially unchanged for a period at least 2T and preferably longer than NT. The integrated signals stored in the buffering devices are optionally processed with analog circuits to produce an analog quantify $a_i$ proportional to the average flux $\Phi_i$ during each time interval $\tau_i$.

Optionally the analog quantity $a_i$ is compared with an analog threshold value to produce information about the incident flux.

Optionally, and possibly on the basis of the optional analog comparison, the analog quantity $a_i$ is transferred to a conventional ADC and converted into digital form.

Optionally, the set of Nd integrated signals in the buffer devices are transferred to one or more ADC's of conventional design and converted to digital values. The digital values are then processed with a digital processing device to provide numbers proportional to the average flux $\Phi_i$ during each time interval $\tau_i$.

The integrators are any device known in the art that sum a signal. The integrator may be, for example a capacitor. The buffers are any device known in the art that stores a signal substantially unchanged. The buffer may be, for example a capacitor that stores electric charge. The gates are any device known in the art that switches a signal from one path to two or more alternate paths. The term "signal" here refers to an analog quantity such as a quantity of electrons or a voltage. Preferably the input signal and switched signal are related by a constant of proportionality. Ideally the constant of proportionality is one. The gate may be for example an electronic MUX. The temporal response of a standard MUX in prior art may be insufficient for some high frequency applications of the present invention. In some embodiments, the arrangement herein includes delay lines as described further below to achieve temporal resolution for the ADC system as a whole better than the temporal resolution of the gate elements. In some embodiments, the invention includes an electro optical switching mechanism as described in further detail below to achieve temporal resolution better than the temporal resolution of the gate elements.

In one embodiment the arrangement provides the following steps:

collecting the incident particle flux in each time interval;

directing the particle flux into a conditioning device that outputs N conditioned particle fluxes with amplitude proportional to the incident particle flux along N different paths to a gating device on each said N paths;

each said gating device operating to direct particle flux along one of at least two different gated paths at each time interval according to a code sequence unique to each said gating device;

directing the particle flux along each of the gated path to a respective integrating device; (however one of the two paths may be a dead end so that in this case only one of the paths is integrated)

each said d integrating devices operating to produce an electrical signal proportional to the integrated particle flux over N time intervals;

and analyzing said Nd electrical signals to obtain information about the amplitude of the incident particle flux over N time intervals;

wherein each unique code sequence is of length N and has at least two different elements specifying at least two different gated paths and d is greater than or equal to one.

That is when d=1 one path is a dead end and is not used.

Optionally the steps include directing each electrical signal to a buffering device that operates to store said electrical signal.

In one arrangement where the analysis is carried out by ADC, the steps include:

directing each said electrical signal to an analog to digital converter that operates to produce a digital value proportional to the electrical signal;

and directing said Nd digital values to a digital computing device.

In another embodiment where analysis is carried out by ADC to produce time sequence d=1 case, the steps include:

directing each said electrical signal to an analog to digital converter that operates to produce a digital value proportional to the electrical signal;

directing said N digital values to a digital computing device;

arranging said N digital values into a data vector Y;

and multiplying said data vector Y by a matrix H to obtain information about the amplitude of the incident particle flux over N time intervals;

where d is equal to one, the matrix H is the inverse of a matrix Z, Z has N rows of length N, each corresponding to one gating device and each row of Z is the unique code sequence for one gating device.

In another embodiment where analysis is carried out by ADC to produce time sequence Hadamard case, the steps include:

directing each said electrical signal to an analog to digital converter that operates to produce a digital value proportional to the electrical signal;

directing said N digital values to a digital computing device;

arranging said N digital values into a data vector Y;

and multiplying said data vector Y by a matrix H to obtain information about the amplitude of the incident particle flux over N time intervals;

where d is equal to one, the matrix H is the inverse of a matrix Z, Z has N rows of length N, each corresponding to one gating device and each row of Z is the unique code sequence for one gating device and each row of Z is the unique code sequence for one gating device wherein the unique code sequences are cyclic permutations of a Hadamard sequence.

In another embodiment where analysis is carried out by ADC to produce time sequence HEMS case, the steps include:

directing each said electrical signal to an analog to digital converter that operates to produce a digital value proportional to the electrical signal;

directing said Nd digital values to a digital computing device;

arranging said Nd digital values into a data vector Y;

and multiplying said data vector Y by a matrix H to obtain information about the amplitude of the incident particle flux over N time intervals;

where d is greater than one, and the matrix H is $(Z^T Z)^{-1} Z^T$, Z has dN rows, and each row of Z is the unique code sequence for one gating device wherein the unique code sequences are pseudo random sequences.

In another embodiment where analysis is carried out in hardware general case, the steps include:

directing each said electrical signal to a hardware processor that operates to produce combinations of said electrical signals;

and comparing at least one said combination with a threshold electrical signal value to obtain information.

In another embodiment where analysis is carried out in hardware PCA case, the steps include:

directing each said electrical signal to a hardware processor that operates to produce projections of said electrical signals onto at least one principle component;

and comparing at least one said projection onto a principle component with a threshold electrical signal value to obtain information about the input.

In another embodiment where analysis is carried out in hardware general case with ADC follow-up, the steps include:

directing each said electrical signal to a hardware processor that operates to produce combinations of said electrical signals;

comparing at least one said combination with a threshold electrical signal value to obtain information;

based at least in part on said information, directing at least one said electrical signal to an analog to digital converter for conversion into a digital value;

and analyzing at least one digital value to obtain information about the input signal.

In another embodiment where analysis is carried out in hardware general case, with ADC follow up to time sequence. the steps include:

directing each said electrical signal to a hardware processor that operates to produce combinations of said electrical signals;

and comparing at least one said combination with a threshold electrical signal value to obtain information;

and based at least in part on said information, directing N electrical signals;

directing each said electrical signal to an analog to digital converter that operates to produce a digital value proportional to the electrical signal;

directing said Nd digital values to a digital computing device;

arranging said Nd digital values into a data vector Y;

and multiplying said data vector Y by a matrix H to obtain information about the amplitude of the incident particle flux over N time intervals;

where d is equal to one, the matrix H is the inverse of a matrix Z, Z has N rows of length N, each corresponding to one gating device, each row of Z is the unique code sequence for one gating device wherein the unique code sequences are cyclic permutations of a Hadamard sequence.

In another embodiment where analysis is carried out in hardware general case with ADC follow up to time sequence, the steps include:

directing each said electrical signal to a hardware processor that operates to produce combinations of said electrical signals;

and comparing at least one said combination with a threshold electrical signal value to obtain information;

and based at least in part on said information, directing at least one said electrical signal directing each said electrical signal to an analog to digital converter that operates to produce a digital value proportional to the electrical signal;

directing said Nd digital values to a digital computing device;

arranging said Nd digital values into a data vector Y;

and multiplying said data vector Y by a matrix H to obtain information about the amplitude of the incident particle flux over N time intervals;

where d is greater than one, the matrix H is $(Z^T Z)^{-1} Z^T$, Z has dN rows, and each row of Z is the unique code sequence for one gating device wherein the unique code sequences are pseudo random sequences.

In some embodiments the signal conditioning device includes a component to detect the start of a periodic signal sequence and which produces a start signal. The start signal in turn causes each gate device to begin its coded sequence at a constant time delay relative to said start signal. For example the start detection component can be a comparator. Further, the embodiment may include a delay path from the signal source to the gate devices so that the start signal arrives at the gate devices before the signal to be measured.

The code sequence of length N for each gate device includes at least two distinct values. That is, for at least one interval in the set of N intervals, the gate device delivers flux φ to destination different from the destination in the first interval. Preferably, the code sequence assigns approximately the same number of intervals to each destination. In some embodiments the code sequence is a Hadamard sequence. In some embodiments the code sequence is pseudo-random. Each code element specifies which integrating device (or no integrating device) to use for one interval τ. For example, if d=4 and the code element is 3, the flux is directed to the $3^{rd}$ integrating device.

In an important embodiment, each gate device is connected with two or more sets of integrating devices and the code sequence operates on only one set for each integration period T. This feature is useful because practical integrating devices such as capacitors require a period to reset. In this embodiment, one set is integrating while the other sets are transferring integrated signal and resetting to zero.

In some embodiments, the signal conditioning device splits the incident flux Φ into two equal parts. One part is unaltered. The second part is inverted and sent on a path that introduces a delay T. The second part is recombined with the first part, and the combined flux is divided into N parts and directed along paths to N gate devices as described above. In this embodiment, each integrating device contains the integrated signal over the previous N intervals. That is for each signal added, the same signal is subtracted a period T later. This embodiment eliminates the latency T as a new set of integrated signals is available after each interval τ.

In some embodiments, there is one integrating device connected with each gate device and the possible states of the code sequence are either connected to the integrator or unconnected. This embodiment has the same overall throughput as prior are interleaved systems, but adds the multiplex advantage to improve the SNR.

In some embodiments, d=1 and the code sequence is a Hadamard sequence. In this embodiment $$Y = ZB + \varepsilon \quad (1)$$

where Y is a vector of measured parameters, B is a vector describing the particle flux Φ in which each successive row of B corresponds to the average flux during successive period τ, and Z is a matrix of coefficients describing how much of the particle flux from each value of the flux field goes into each measurement of observed parameters Y and ε is the error. If the integration intervals τ are unequal, the coefficients of the Z matrix are weighted by the actual values to compensate. Equation 1 has solution $$B = Z^{-1} Y \quad (2)$$

The Hadamard embodiment makes the same number of measurements as the sequential interleaved scheme in prior art systems, but errors due timing jitter are reduced because average values over a period t are calculated rather than the instantaneous value at an instant. Further, the multiplex method reduces uncorrelated noise generated in the electronics in proportion to $N^{-1/2}$. Noise entering the signal before the input stage of the invention is faithfully reproduced for single event. If the signal is recurring, the multiplex method will also reduce uncorrelated noise entering the signal before the input stage.

In a preferred embodiment, d>1 and code sequences are cyclic permutations of a pseudo-random sequence chosen to minimize measurement error. As discussed in the HEMS application, equation 1 in this case has the least squares solution:

$$B = (Z^T Z)^{-1} Z^T Y \quad (3)$$

$$H = (Z^T Z)^{-1} Z^T \quad (4)$$

All of the comments about noise reduction in the Hadamard embodiment above also apply to this embodiment, except that the magnitude of the SNR is greater and hence this embodiment is preferred. This embodiment requires d times the sample throughput of prior art high rate ADC systems. The advantage of this embodiment is that the signal to noise ratio (SNR) is higher and consequently higher bit depth for equivalent sampling rate is achievable. Other statistical methods can be used. Those skilled in the art will recognize that equations 2 and 3 apply to cases where the uncertainties in measured values are equal and that alternative forms have been derived for cases where the uncertainties are unequal. Other methods such as neural networks can be used, and are particularly useful in cases where the uncertainties in measured parameters Y are unequal.

In some d>1 embodiments, the flux Φ is divided unequally between paths and the integrated signals along each path are multiplied by a calibration constant such that the sum of integrated signal over all integrating devices d on a path multiplied by said calibration constant is the same for all N paths.

In some embodiments, the analog values of Y are delivered to a conventional ADC, digitized, and the time sequence B=HY is calculated by the digital processing device.

In some embodiments, the analog values of Y are delivered to a conventional ADC, digitized with a first bit resolution and the digital representation of Y is analyzed by a digital processing device to obtain first information and based at least in part on said first information, a decision is made whether or not to process the same analog values of Y with an ADC of conventional design with second bit resolution. This embodiment is useful for applications where the data of interest is sparse. For example, a radar application might process all of the Y vectors with a fast 8 bit ADC and based on the result of analysis, deliver some of the Y vectors from buffering devices to a slower 24 bit ADC in order to analyze signals of interest at higher resolution.

In some embodiments, the matrix multiplication HY is performed by analog circuits and the result is stored in buffer devices in analog form.

In some embodiments the analog values of B are compared with threshold analog values and an action is taken based at least in part on the result of the comparison.

In some embodiments, the linear combinations of the analog values of Y are calculated by analog circuits and at least one of the linear combinations is compared with at least one threshold value and an action is taken at least in part based on the result of the comparison. This feature is useful for pattern recognition by for example Principle Component Analysis (PCA). In this example, the projections onto the principle components are linear combinations of the Y data vector. Note that the same result is found if B is calculated first, albeit with more computation required. In a radar application the analog comparison could be used to sort signals of interest from background noise and then to digitize only the signals of interest.

In some embodiments, Nd integrated analog signals from each integration period are buffered and only one conventional ADC processes all Nd analog values read sequentially from buffer devices. Those skilled in the art will recognize that the offset and gain errors disappear within blocks of N flux values corresponding to one sampling period T. Of course, additional ADC's will be required to process blocks acquired during the time it takes one ADC to process Nd samples and there will be offset and gain errors between blocks handled by different ADC's. The advantage of this embodiment is that the errors are just level shifts at predictable intervals T and easily corrected in the digital domain.

In some embodiments, an array of buffer devices is connected with at least two types of ADC elements A and B. A type A ADC is capable of operating at rate f/N outputting a digitized result with bit depth $b_a$. A type B ADC operates at a lower rate than f/N, but outputs a digitized result with bit depth $b_b > b_a$. For an example, in a hypothetical 4 GHz system with 500 MHz ADC's, type A is a 500 MHz ADC that outputs an 8 bit result and type B as a 4 MHz ADC that outputs a 24 bit result. In operation, the system functions as follows. The type A ADC's digitizes all of the samples in the sample space and hardware or software processors separates the time series into regions with background and regions with a feature of interest. The buffers corresponding to the feature of interest are read by the type B ADC and the higher resolution results are analyzed to obtain information about the feature of interest.

In some applications, the desired temporal resolution δ is less than the gate switching time τ of the hardware employed. Let p=τ/δ be the ratio between the minimum gate switching time and the desired temporal resolution. Further, p is rounded to the nearest integer. For example, if the minimum switching time for a MUX is 5 ns and the required δ is 50 ps, then p=100. The gate switching time is not a limiting factor per se because the gate function merely convolutes the higher resolution signal. Since the gate function is known, the higher resolution signal can be recovered by deconvolution. The ultimate temporal resolution does not depend on the gate period, but rather the smallest possible offset to the start of the gate period. The offset to the start of a gate period can be generated in a FPGA, for example. Alternately varying the length of control lines to the gate device can be of different lengths so that control signals propagating along longer lines arrive later. If the path for an electron traveling at c/3 is changed by 1 micron, the difference in time of arrival is 10 fs. Although the increments in the delay line are preferably of equal length, it is not necessary. All that is required is that the increments differ from one another by approximate integer multiples of δ and that their lengths are known. To elaborate, the present method finds the average flux during the actual time intervals of the integration and it is understood that the calculated result has uneven time intervals that reflect the measurement time intervals. A result with equal time intervals can be obtained by interpolation. For illustrative purposes, two methods using deconvolution are outlined below.

The first mathematical approach is to model the measurement as a set of p time series of total length T offset one from the next by δ. Each time series is determined separately as $B_n = HY_n$, where n runs from 1 to p. In this case H has N rows. The resolution of each time series is limited to c by the gate. The p time series of length N are interleaved to give a combined series of length pN with point spacing δ. The resulting time series is a convolution of the signal with the gate period τ. Since τ, and presumably the shape of τ is known, the signal can be recovered by standard deconvolution methods known to those skilled in the art, for example Fourier deconvolution.

The second mathematical approach is to model the system like the Toeplitz case discussed in the HEMS application. In this case, the dimension of Z is increased by a factor of p. In a preferred embodiment Z contains at least two block sizes s and t of different length that don't have a common divisor. Further, s and t are integers greater than or equal to the minimum block size p. Preferably s and t are also prime numbers. In most preferred embodiments there are more than two block lengths and the lengths are prime numbers. The number of choices for the multiplexing sequence Z is very large with some choices giving a better signal-to-noise ratio (SNR) than other choices.

For a static spatial mask, in the Toeplitz case, the matrix $(Z^T Z)^{-1}$ is singular and hence the transform matrix $H=(Z^T Z)^{-1} Z^T$ is not valid. However, the convolution due to motion of a spatial mask during measurement renders $(Z^T Z)^{-1}$ non-singular and data points at a higher nominal resolution can be calculated as discussed in the HEMS application. The achievable signal to noise ratio (SNR) depends on the details of the convolution. Likewise, the finite transition time of the gate produces a temporal convolution that renders $(Z^T Z)^{-1}$ non-singular. Specifically, there is some division of flux to different integrators during the switching time that provides the needed convolution. The signal is calculated directly as B=HY. Hence, by methods previously described for spatial resolution, it is possible to achieve finer temporal resolution than the width of a modulator element, albeit with some degradation in the SNR.

In some embodiments, the incident flux Φ is split into Np equal parts; each part is directed to a gate, each gate device directs flux to an integrating device specified by a code sequence of length Np; the integrating devices integrate the signals; and the integrated signals are analyzed to determine the temporal dependence of the input flux wherein the code sequence consists of sub sequences of length greater than or equal to p. This embodiment corresponds to the Toeplitz case described in the HEMS application.

In some embodiments the gate device is comprised of one or more electro-optical devices that divert incident photon flux into different integrating devices in response to control signals. In a preferred embodiment two sequential electro-optical devices divert incident photon flux into integrating devices arranged along a closed path wherein the integrating devices are shaped to implement a code sequence. Preferably the integrating devices integrate photo-electrons produced by the photo-electric effect when the photon flux is incident on said integrating device.

In some embodiments the gate device is comprised of one or more electric deflection devices that divert incident electron flux into different integrating devices in response to control signals. In a preferred embodiment two sequential electric deflection devices divert incident electron flux into integrating devices arranged along a closed path wherein the integrating devices are shaped to implement a code sequence.

BRIEF DESCRIPTION OF THE DRAWINGS

FIG. 1 is a schematic of a PRIOR ART high rate interleaving ADC operating at frequency f samples per second.
FIG. 1A is an illustration of the signals of the ADC of FIG. 1 including the input signal 303 and a series of clock signals.

FIG. 4 shows a series of example waveforms including time shifted signals generated by delay lines to shift the start of an integration interval by less than a clock period.

DETAILED DESCRIPTION

Figure 2:
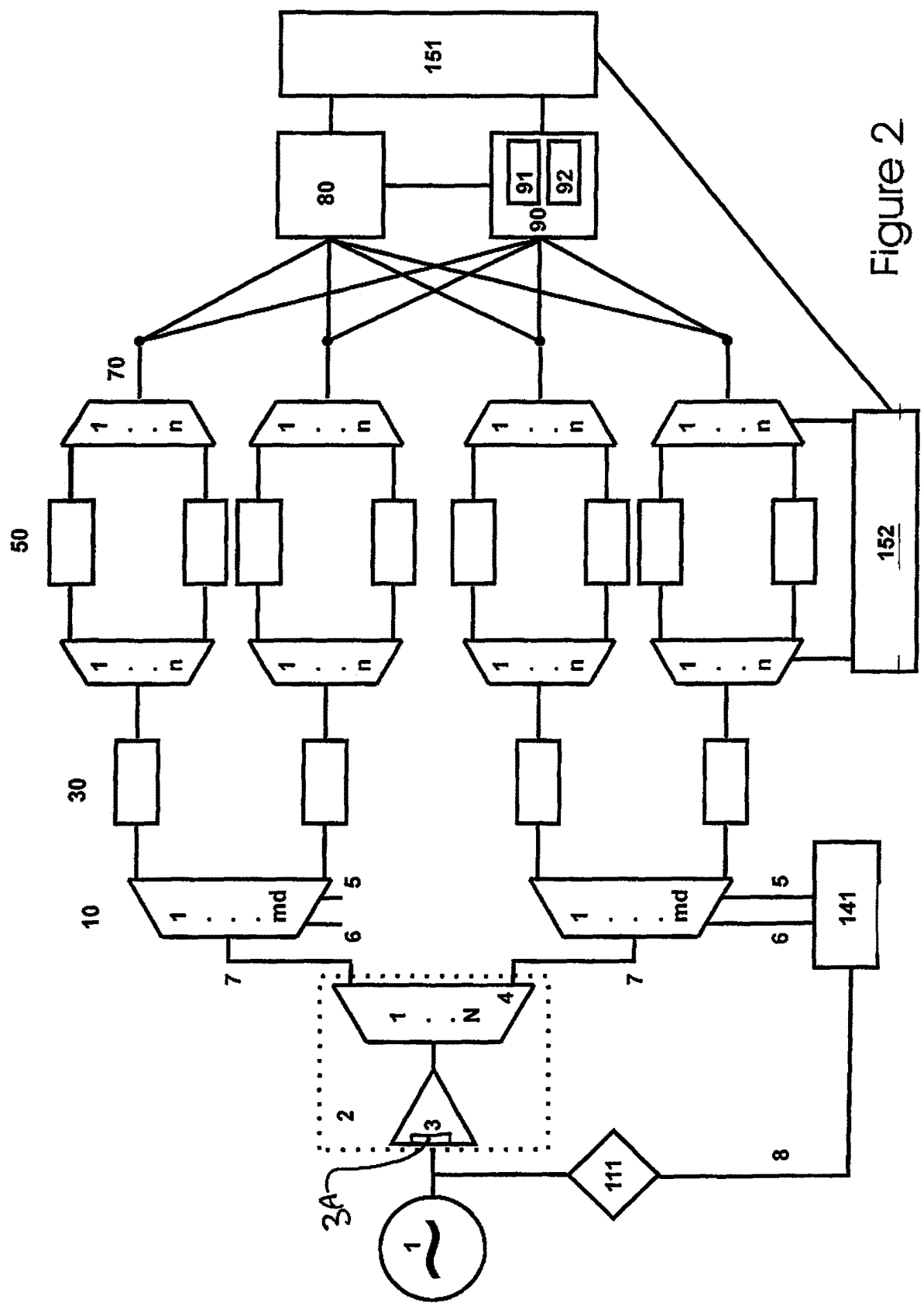
FIG. 2 shows a preferred embodiment of the present invention.

FIG. 1 shows a schematic view of a high speed analog to digital conversion system according to prior art. Analog input 1 is amplified 2 and the resulting analog signal 303 is transmitted to switch 11 connected to timing control 141. Each clock cycle at frequency f, timing control 141 increments the address of the ADC in stack to connect with the analog cycle and resets to the first address after the last address is connected. In the example shown, the ADC's in the stack are connected in the repeating sequence 81, 82, 83, 84. The clock input is indicated as 304 and the waveforms for ADC's 81, 82, 83, and 84 are indicated as 121, 122, 123 and 124, respectively. The value of the input signal 303 is captured on the rising edge of the timing pulse for each ADC. That is ADC's 81, 82, 83 and 84 read the signal at the indicated instants 221, 221, 223, and 224, respectively. Each ADC in the stack outputs a digital result at frequency f/N (f/4 in the example shown) to interleaver 121, which passes an ordered sequence of digital values to computation device 151. Computation device 151 processes the raw stack ADC outputs to reduce the effects of offset, gain and timing errors. There is a one-to-one relationship between each sample interval and a corresponding ADC.

FIG. 2 shows a general schematic of the invention. Particle flux is collected and enters the system at 1 as an analog signal. The analog signal enters conditioning device 2 that includes amplifier 3 and splitting device 4. The conditioning device 2 can also include a filter 3A which operates to reject at least a part of the input particle flux amplitude. Splitting device 4 and amplifier 3 work together so as to produce N clones of analog signal 1 with amplitude (or equivalently particle flux) at each instant in time proportional to the amplitude of analog signal 1. The N cloned analog signals denoted 7, are directed to N gate devices generally indicated as the column 10. The paths 7 are arranged in a manner such that the signal arriving at each gating device is in phase with the signal at all of the other gates. The operation of gate devices 10 is coordinated by timing control 141 which directs timing signals 5 and control signals 6 to each gate device 10. Optionally, the input signal 1 is compared with a threshold 111 and if a threshold condition is met a signal 8 is transmitted to timing control 141. The signal lines are arranged such that the propagation delay for the cloned signals 7 is greater than or equal to the propagation delay for the threshold signal 8 plus the timing and control signals 5 and 6. The threshold comparison 111 can be used, for example to detect the start of a transient signal and to synchronize subsequent data acquisition. This enables the arrangement herein to compare the input signal with a reference signal relative to the same threshold. The gate devices 10 select one of md paths in accordance with a code sequence and direct the cloned signal 7 along said selected path to an integrating device generally indicated in column 30. The integrating devices integrate the cloned signal incident for N integration intervals.

Figure 3:
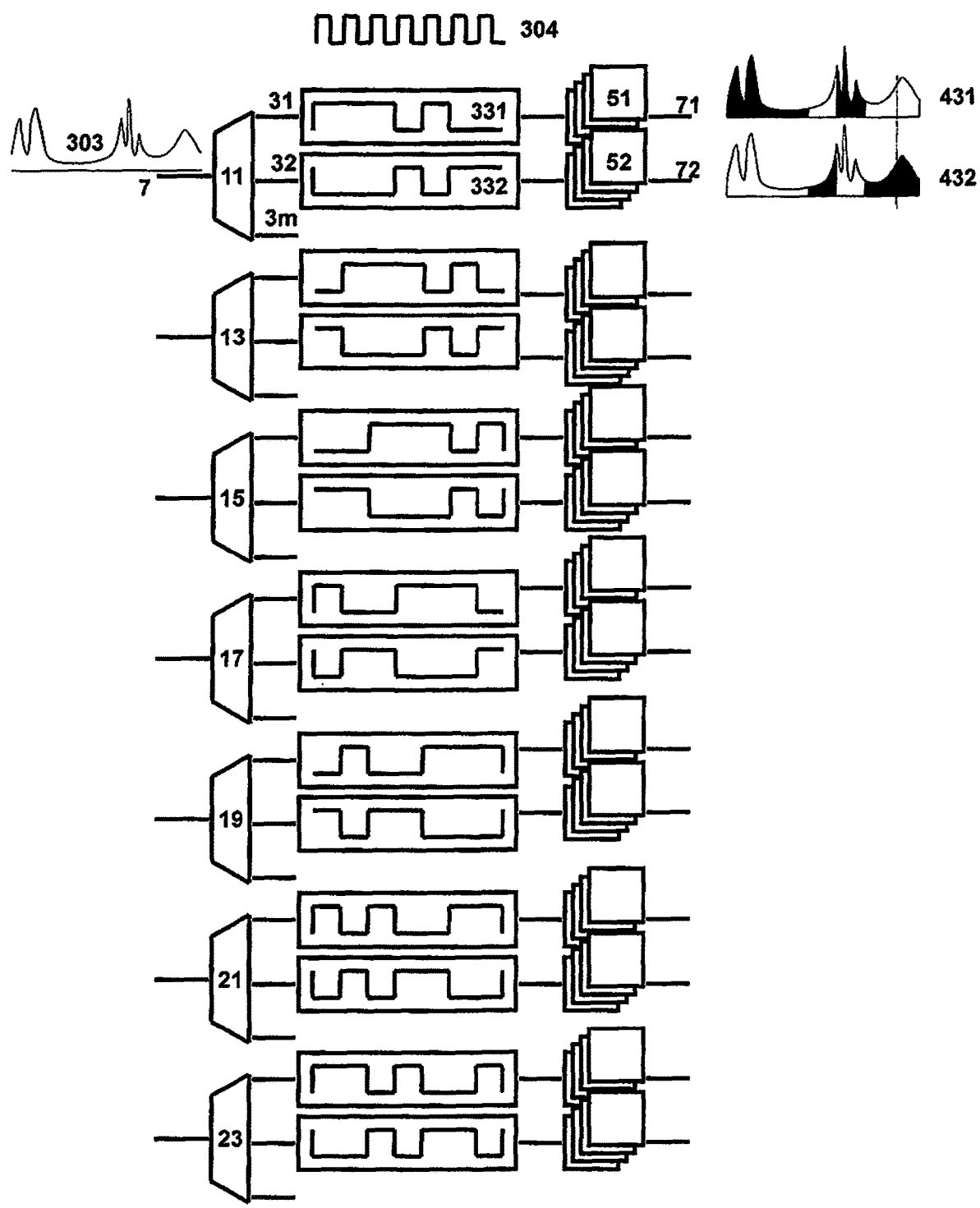
FIG. 3 shows a schematic view of a multiplex integration unit for use in the embodiment of FIG. 2 using seven gate devices.

As better shown in FIG. 3, the cloned waveform 303 on signal line 7 is incident on gate device 11 which directs the waveform to either integrating device 31 or integrating device 32 in accordance with a code sequence. In the example shown in FIG. 3, N=7 and d=2. Gating devices 11, 13, 15, 17, 19, 21 and 23 along with two associated integrating devices with sample control waveforms are shown. Each gating device nominally receives the same input signal 7 and consequently the sum over each set of md integrating devices for N integration intervals should be the same. However due to small differences in component parts, the sums may vary. The variance can be corrected in digital processor 151 by summing each set and then dividing each value of the set by the sum as discussed in the HEMS application referenced above. In contrast to the prior art, there is a one-to-N relationship between time interval and integrators. In this example, the waveforms are cyclic permutations of a Hadamard sequence of length 7 and the compliment of each. The waveforms for integrating devices 31 and 32 are shown as 331 and 332, respectively. For reference, the clock signal 304 is shown above. When waveform 331 is high, gate device 11 directs the analog waveform 303 on line 7 to integrating device 31. When waveform 332 is high, gate device 11 directs the analog waveform 303 on line 7 to integrating device 32. The integrated portions of the waveform 303 for integrating devices 31 and 32 are shown as the shaded regions of waveforms 431 and 432, respectively. In the example in FIG. 3, at the conclusion of a code sequence, the analog waveform is directed to another pair of integrating devices indicated as 3m that take the places of integrating devices 31 and 32 in all respects for the next N integration intervals. Meanwhile the integrated signal in integrating devices 31 and 32 is transferred to buffer devices 51 and 52, respectively. The buffer devices 51 and 52 are selected from an array of buffer devices by buffer control 152 as shown in FIG. 2. Buffer control 152 operates to make the stored integrated signals in buffer devices 51 and 52 available for processing at a later time on signal lines 71 and 72, respectively. After the integrated signals are transferred to buffers 51 and 52, integrating devices 31 and 32 are reset to prepare for the start of another integration cycle. The multiplicity m is chosen such that at least one set of integrating devices associated with each gating device is available to integrate analog signal while the other set(s) are performing transfer and reset operations. The arrangement with m sets of integrating devices associated with each gate device allows continuous measurement of the input particle flux. A single set of integration devices (m=1) is sufficient if continuous sampling is not required.

Returning to FIG. 2, the integrated signals are stored in buffer devices selected from buffer arrays generally indicated by column 50 by buffer control 152. Buffer control 152 operates to make the contents of those Nd buffer devices within the buffer array corresponding to one integration cycle available on signal lines generally indicated by column 70. The signal lines 70 are an analog representation of the data vector Y with connection to a hardware processor 80 and a bank of ADC's 90 of conventional design containing types 91 and 92. The hardware processor 80 may operate on the data vector Y and transmit an analog signal based at least in part on data vector Y to ADC bank 90. The hardware processor may operate on data vector Y and transmit a logic value based at least in part on data vector Y to digital processor 151. The ADC bank may operate on data vector Y and transit a digital representation of each element of Y to digital processor 151. The digital processor (or the hardware processor via aforementioned logic signal) may generate signals that cause buffer control to make any set of Nd integrated signals stored in a buffer available on signal lines 70.

The array of conventional ADC's contains a plurality of types indicated as 91 and 92 with different speed and ENOB specifications. The hardware processor 80 is operable to generate analog values representing the signal amplitudes, generate analog values representing pattern matching, and compare these analog values to analog thresholds. The hardware processor is linked with the array of conventional ADC's 90 so that any of the derived analog values generated by the hardware processor can be converted to digital form. Both the hardware processor 80 and array of conventional ADC's are connected with digital processor 151, which is also in communication with buffer controller 152.

In some embodiments, the data vector Y is directed to the array of conventional ADC's 90 and a fast conversion is done by ADC's of type 91 to produce a low bit resolution digital representation of data vector Y. The digital representation of Y is transferred to digital processor 151 and a low resolution representation of the input particle flux is calculated via Equation 2 for d=1 or Equation 3 for d>1. The digital processor performs further analysis on the low resolution digital representation of the input particle flux. The further analysis may include correlation, pattern matching, threshold or other function operating on the sequence of N time intervals or on a plurality of such time sequences of N time intervals. Based on further analysis, the digital processor may identify sequence(s) with features of interest and generate logic signals that cause the buffer controller 152 to make integrated signals from said sequence(s) of interest available to high resolution ADC's 92. The high resolution ADC's generate a high bit resolution representation of the sequence(s) and digital processor performs further analysis on said high resolution sequence(s). This embodiment is suitable for applications in which the input particle flux is mostly uninteresting background with sparse intervals containing signals of interest. The signals are filtered at low resolution and only the signals of interest are converted to high resolution digital representations, hence reducing the number of high resolution conversions required and saving associated hardware cost.

In some embodiments, the data vector Y is directed to the hardware processor 80 and the hardware processor generates a set of one or more analog signals based at least in part on the analog values of the input analog data vector Y. Each input data vector Y contains analog information about N time intervals. In some embodiments the hardware processor generates a set of one or more analog signals based at least in part on a plurality of input data vectors Y corresponding to a time sequence of more than N time intervals. The hardware processor may, for example perform correlation or pattern matching by comparing combinations of the elements of Y with analog threshold values. If a threshold value is met, a logic signal may be sent to digital processor 151. If a threshold value is met, the analog representations of the combinations may be directed to ADC bank 90 for conversion to digital values and further processing by digital processor 151. The hardware processor may produce analog outputs according to Equation 2 or Equation 3 and forward said analog outputs to ADC bank 90 for conversion to digital representations and further processing by digital processor 151. This function is useful in embodiments with d>1 to reduce the number of ADC conversions required.

FIG. 4 shows a series of example waveforms generated by delay lines to shift the start of an integration interval by less than a clock period. That is as shown in FIG. 4 first analog signal is phase shifted with respect to a second analog signal at a gate device by less than one clock period. The input analog waveform is shown schematically as 303 and the clock signal is shown as 304. The example integration waveform 331 is the same as 331 on FIG. 3. Integration waveforms 431, 531, 631 and 731 are shifted by q/p of a clock period where p=5 and q is an integer less than 5 in this example. In a hardware embodiment, each integrator waveform is applied to a different gate device. In FIG. 3, there are 7 gate devices. For the example in FIG. 4 there are 35 gate devices, each with a set of integrators as shown in FIG. 3. For the purpose of Equation 3, N is the number of gate devices or 35 in this example. The temporal resolution of the arrangement herein is set by the resolution of the fractional clock delay period rather than by the temporal resolution of the clock frequency.

Figure 5A:
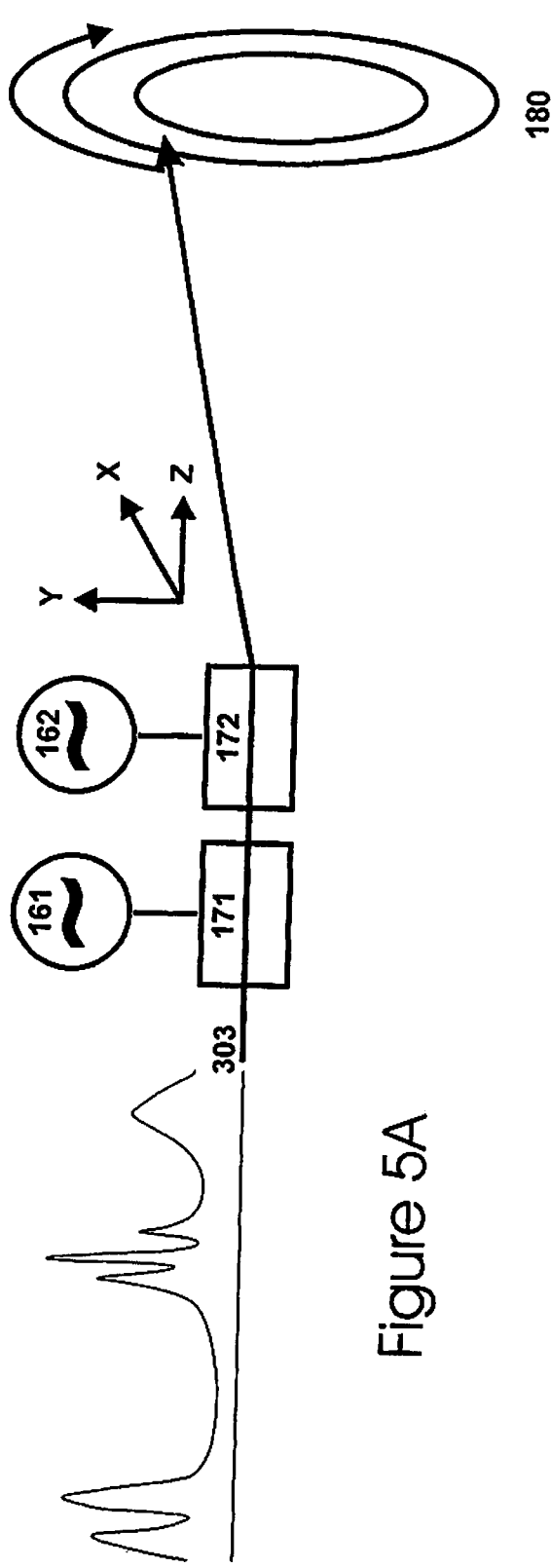
FIG. 5A shows a schematic for a fast switching method.
Figure 5B:
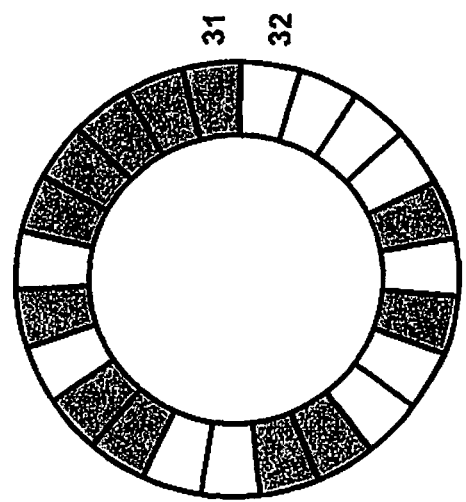
FIG. 5B shows integrating devices are arranged around the ring of FIG. 5A.

FIG. 5A shows a schematic for a fast switching method. An analog beam with time varying amplitude 303 propagates in the z-direction. The analog beam may be comprised of photons or charged particles such as electrons. The beam is incident on a first deflector 171 that adds a vector component in the x-direction proportional to a voltage applied by source 161 to the propagation direction vector. The beam is incident on a second deflector 172 that adds a vector component in the y-direction proportional to a voltage applied by source 162 to the propagation direction vector. If the beam is comprised of charged particles, the deflection at 171 and 172 can be accomplished by applying the voltage between parallel conductive plates. If the beam is comprised of photons, the deflection can be accomplished by applying the voltage to optical elements that change refractive index in response to applied voltage (electro-optic effect). Voltage sources 161 and 162 are adjusted to produce periodic waveforms out of phase so that the direction taken by the beam follows a closed loop. In the example shown in FIG. 5A, voltage sources 161 and 162 output sine waveforms 90 degrees out of phase to produce a beam path that rotates around the surface of a right cone. An array of integrators is placed in a plane perpendicular to the z-direction and the beam intersects the plane in a circular ring shown generally as 180. As shown in FIG. 5B, integrating devices 31 and 32 are arranged around the ring. Regions connected with integrating device 31 are shaded and regions connected with integrating device 32 are white. All of the integration with the same shade are connected to a common integrator. The example shown in FIG. 5B has N=23 zones and hence the temporal resolution is Nf, where f is the frequency of the voltage sources 161 and 162. Since f can be several GHz and N can be 1000 or more, temporal resolution in the THz range is possible with the embodiment shown in FIGS. 5A and 5B.

The arrangement shown in FIGS. 5A and 5B can be used to implement a time of flight (TOF) Raman spectrometer. In conventional designs, a pulsed laser with a duty cycle much less than 1% is used to excite Raman spectra from a sample. The Raman scattered radiation is collected and transmitted along an optical fiber with dispersion: that is a refractive index that varies with wavelength. Due to dispersion, different Raman scattered wavelengths travel with different speeds and become spaced out temporally. The temporal signal is measured with each wavelength arriving in sequence. The spectral resolution is controlled by the length of the laser pulse and the length of the optical fiber. The temporal spectrum is a convolution of the laser pulse with the temporal Raman spectrum. A longer optical fiber increases the temporal separation of wavelength components of the Raman spectrum at the expense of increased signal attenuation. With the arrangement of the present invention, the laser illumination can be continuous increasing the duty cycle by a factor of 100 or more. Further, the intensity of continuous illumination can be regulated avoiding 5% variation in pulse strength characteristic of pulsed sources. The signal to noise ratio is improved both by the higher duty cycle and improved stability of the exciting illumination source. In the arrangement shown in FIGS. 5A and 5B, the EO elements 171 and 172 take a continuous flux of Raman scattered photons and divide that flux into very short temporal intervals in the encoder ring 180. The region types 31 and 32 each pass through a dispersive medium such as a fiber optic of length L and then are each directed by gates and integrated for N periods. In this embodiment, the EO devices are the gate device of FIG. 3 and the code sequence is hard coded as the pattern on loop 180. The EO devices operate to produce N cyclic permutations of the base pattern achieved by delaying or advancing the start of each integration period by one segment. The Raman spectrum is calculated via Equation 3 once N integration sequences have been completed. The very short effective pulse length achieved by this method both improves spectral resolution and improves SNR by reducing absorption losses because a shorter length L of dispersive medium is required. In a related embodiment, the Raman scattered signal incident on each segment becomes the particle flux input 1 on FIG. 2. The related embodiment combines high spectral resolution with high temporal resolution. The method described is not limited to Raman spectroscopy and can be used to analyze other spectral sources.

The TOF method described above is applicable to other types of spectral measurements.

The invention claimed is:

1. A method for measuring amplitude of an incident particle flux comprising the steps of:
   receiving the incident particle flux;
   collecting over N time intervals the incident particle flux in each of the time intervals;
   directing the particle flux into a conditioning device that outputs N conditioned particle fluxes, each with amplitude proportional to an input particle flux amplitude of the incident particle flux, along N different paths to a respective gating device on each of said N paths;
   each said gating device operating to direct particle flux along one of at least two different gated paths at each time interval according to a code sequence unique to each said gating device;
   directing the particle flux along each gated path to d integrating devices;
   each said d integrating devices operating to produce output particle flux proportional to the integrated particle flux over N time intervals;
   and analyzing said Nd output particle fluxes with a processing device to obtain information about the amplitude of the incident particle flux over N time intervals;
   wherein each unique code sequence is of length N and has at least two different elements specifying at least two different gated paths and d is greater than or equal to one;

where
N is a (positive integer)>2 length of code sequence and number of paths for "equivalent" signals from amplifier ie original signal is amplified N-fold and split into N parts following N paths;
N=number of time intervals;
d is a positive integer number of integrating channels d=1 Hadamard d>1 HEMS
Nd is a positive integer number of integrated signals.

2. The method according to claim 1 wherein the incident particle flux is selected from photons, electrons, neutrons and charged particles.

3. The method according to claim 1 wherein the conditioning device includes an amplification stage that operates to increase the total particle flux amplitude summed over all N paths to an amplitude greater than the input particle flux amplitude.

4. The method according to claim 1 wherein the conditioning device includes a transducer device that operates to convert the input particle flux amplitude into an electrical signal proportional to the input particle flux amplitude.

5. The method according to claim 4 wherein the conditioning device further generates an inverted electric signal for each time interval k and adds said inverted electric signal to the output for time interval k+N;
where k+N is a positive integer and k is time interval index.

6. The method according to claim 1 wherein the conditioning device includes a transducer device that operates to convert the input particle flux amplitude into photon flux amplitude proportional to the input particle flux amplitude.

7. The method according to claim 1 wherein the gating device operates to direct particle flux into at least two different directions at different times and said directed flux is incident on a plane containing at least one of said d integrating devices.

8. The method according to claim 7 wherein the directed particle flux is projected onto a plane containing a plurality of integrating devices arranged around a closed loop and said directed particle flux is incident on different sections of said loop at different times.

9. The method according to claim 1 wherein each gating device directs particle flux to a first set of said d integrating devices for a first set of N integrating intervals and to a second set of said d integrating devices for a second set of N integrating intervals.

10. The method according to claim 1 wherein the unique code sequence operable at each gating device is a pseudo random sequence and wherein the code sequence operable at each gating device is derived from cyclic permutations of one or more base pseudo random sequences.

11. The method according to claim 10 wherein at least one of said base pseudo random sequences is a Hadamard sequence.

12. The method according to claim 1 wherein each of said d integrating devices includes a transducer that operates to convert particle flux incident thereon into an electric signal proportional to the amplitude of particle flux incident thereon.

13. The method according to claim 1 wherein each of said d integrating devices includes a transducer that operates to convert particle flux incident thereon into a photon flux proportional to the amplitude of particle flux incident thereon.

14. The method according to claim 1 wherein integrated particle flux from each of said integrating device is transferred to a buffering device for at least one time interval wherein said buffering device operates to preserve said integrated particle flux.

15. The method according to claim 1 wherein linear combinations of integrated particle flux are calculated by a processing device and said linear combinations are determined from the code sequences operable at each gating device.

16. The method according to claim 12 wherein the electric signals from said d integrating devices are converted to numeric values proportional to their integrated flux amplitudes by analog to digital converters and said numeric values are analyzed to provide information about the particle flux.

17. The method according to claim 1 wherein the temporal value for each time interval is a linear combination of the integrated signal values.

18. The method according to claim 17 wherein integrated signal values are converted to a digital form with an analog to digital converter and the temporal value for each temporal interval is a linear combination of digital values.

19. The method according to claim 17 including an additional step of composing a linear combination of integrated signal values by an analog circuit.

20. The method according to claim 19 wherein an output of the analog circuit is compared with a threshold value and the output of the analog circuit is converted to a digital value if a threshold condition is met.

21. The method according to claim 17 wherein the temporal sequence is calculated as B=HY, where H is as defined in the specification above;
where B is a vector/column matrix N×1 output time spectrum describing the particle flux $\phi$ in which each successive row of B corresponds to the average flux during successive period;
H is a matrix=$(Z^TZ)^{-1}Z^T$;
Y is a vector/column matrix length Nd
HY is a matrix*vector=vector.

22. The method according to claim 17 wherein a first analog signal is phase shifted with respect to a second analog signal at a gate device by less than one clock period.

* * * * *